(12) United States Patent
Sellers

(10) Patent No.: US 8,946,570 B2
(45) Date of Patent: Feb. 3, 2015

(54) KEYBOARD SYSTEMS UTILIZING A SWITCH AND PROXIMITY SENSORS

(75) Inventor: Charles A. Sellers, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 169 days.

(21) Appl. No.: 13/699,622

(22) PCT Filed: Jun. 3, 2010

(86) PCT No.: PCT/US2010/037327
§ 371 (c)(1),
(2), (4) Date: Nov. 21, 2012

(87) PCT Pub. No.: WO2011/152826
PCT Pub. Date: Dec. 8, 2011

(65) Prior Publication Data
US 2013/0068601 A1 Mar. 21, 2013

(51) Int. Cl.
*H01H 9/26* (2006.01)
*G06F 3/02* (2006.01)
*H03K 17/95* (2006.01)
*H03K 17/955* (2006.01)

(52) U.S. Cl.
CPC ........ *G06F 3/0202* (2013.01); *H01H 2219/037* (2013.01); *H01H 2219/062* (2013.01); *H01H 2239/006* (2013.01); *H03K 17/95* (2013.01); *H03K 17/955* (2013.01)
USPC .......................................... 200/5 A; 345/168

(58) Field of Classification Search
USPC .......... 200/5 A, 1 B, 310, 314; 345/168, 169, 345/158
See application file for complete search history.

(56) References Cited

U.S. PATENT DOCUMENTS

| | | | |
|---|---|---|---|
| 6,824,321 B2 | 11/2004 | Ward et al. | |
| 7,151,528 B2 * | 12/2006 | Taylor et al. | 345/168 |
| 2007/0013664 A1 | 1/2007 | Lee et al. | |
| 2007/0105604 A1 | 5/2007 | Choo et al. | |
| 2008/0074392 A1 | 3/2008 | Mustafa et al. | |
| 2008/0100580 A1 * | 5/2008 | Han | 345/168 |
| 2009/0273567 A1 | 11/2009 | Milley et al. | |
| 2011/0241997 A1 * | 10/2011 | Yang | 345/168 |

FOREIGN PATENT DOCUMENTS

| | | |
|---|---|---|
| JP | 2005352987 | 12/2005 |
| JP | 2006012110 | 1/2006 |
| JP | 2006107091 | 4/2006 |
| JP | 2009217677 | 9/2009 |
| KR | 20100041550 | 4/2010 |

OTHER PUBLICATIONS

WIPO, International Search Report dated Mar. 24, 2011, PCT App No. PCT/US2010/037327 filed Jun. 3, 2010.

* cited by examiner

*Primary Examiner* — Vanessa Girardi
(74) *Attorney, Agent, or Firm* — Hewlett-Packard Development Company

(57) ABSTRACT

A keyboard apparatus is provided. The apparatus can include a rigid member comprising a plurality of keycaps and a proximity sensing member comprising a plurality of proximity sensors and a plurality of illuminators disposed proximate the rigid keycap member. The apparatus can also include a backing member comprising a switch disposed proximate the proximity sensing member. A displacement of the rigid member and the proximity sensing member can activate the switch.

15 Claims, 5 Drawing Sheets

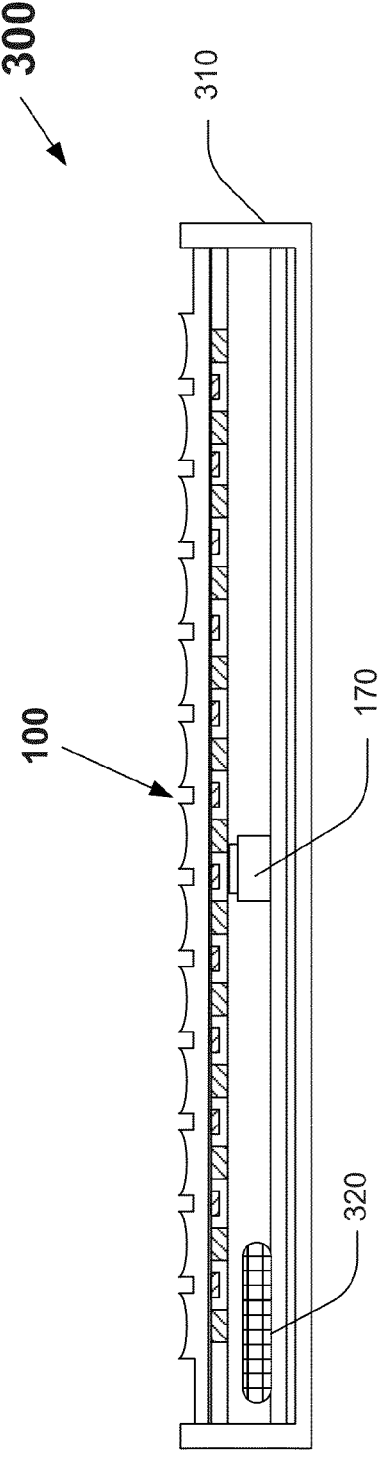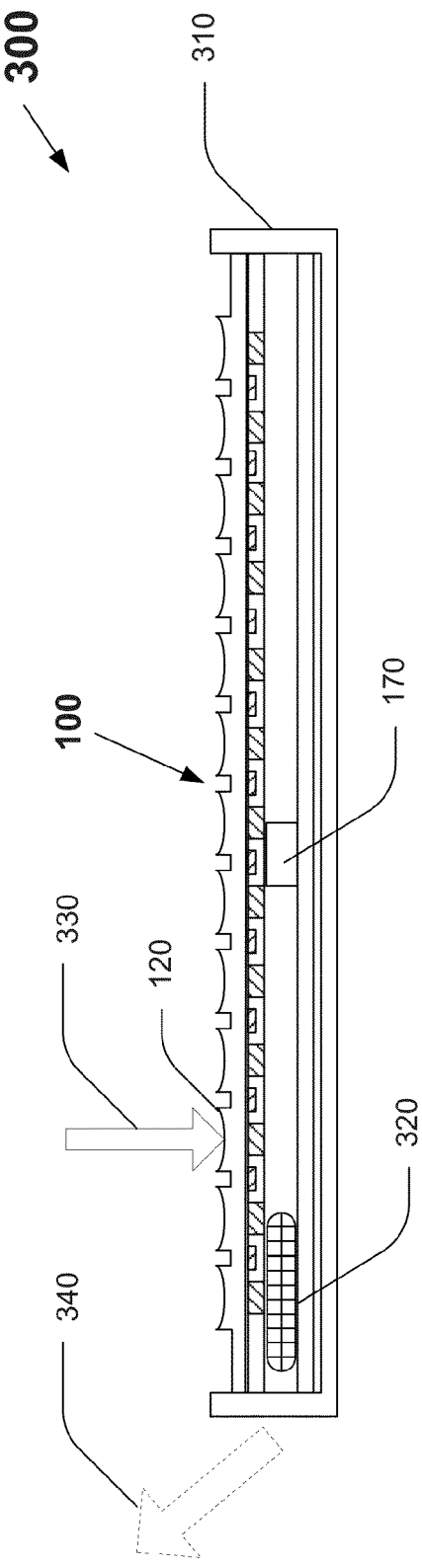

KEYBOARD SYSTEMS UTILIZING A SWITCH AND PROXIMITY SENSORS

BACKGROUND OF THE INVENTION

Description of the Related Art

Many electronic devices rely upon user input to perform meaningful functions. Such user input can include touch, gestures, and similar inputs, however the most common devices used to obtain user input include the keyboard and the mouse. Keyboards are extremely versatile, as they can be adapted to a variety of languages and operating systems. Despite their common appearance and overwhelming ubiquity, keyboards remain fairly complex electro-mechanical devices, frequently having a plethora of switches, moulded components, transmitters, and onboard processors for communicating signals based upon user input. Such complexity becomes extraordinarily difficult to reliably package in a keyboard adapted for use with the increasing number of portable electronic devices.

BRIEF DESCRIPTION OF THE DRAWINGS

Advantages of one or more disclosed embodiments may become apparent upon reading the following detailed description and upon reference to the drawings in which:

FIG. 3A is a partial sectional view depicting the illustrative keyboard apparatus depicted in FIG. 1 disposed in a first position, according to one or more embodiments described herein;

FIG. 3B is a partial sectional view depicting the illustrative keyboard apparatus depicted in FIG. 1 disposed in a second position, according to one or more embodiments described herein;

DETAILED DESCRIPTION

Figure 1:
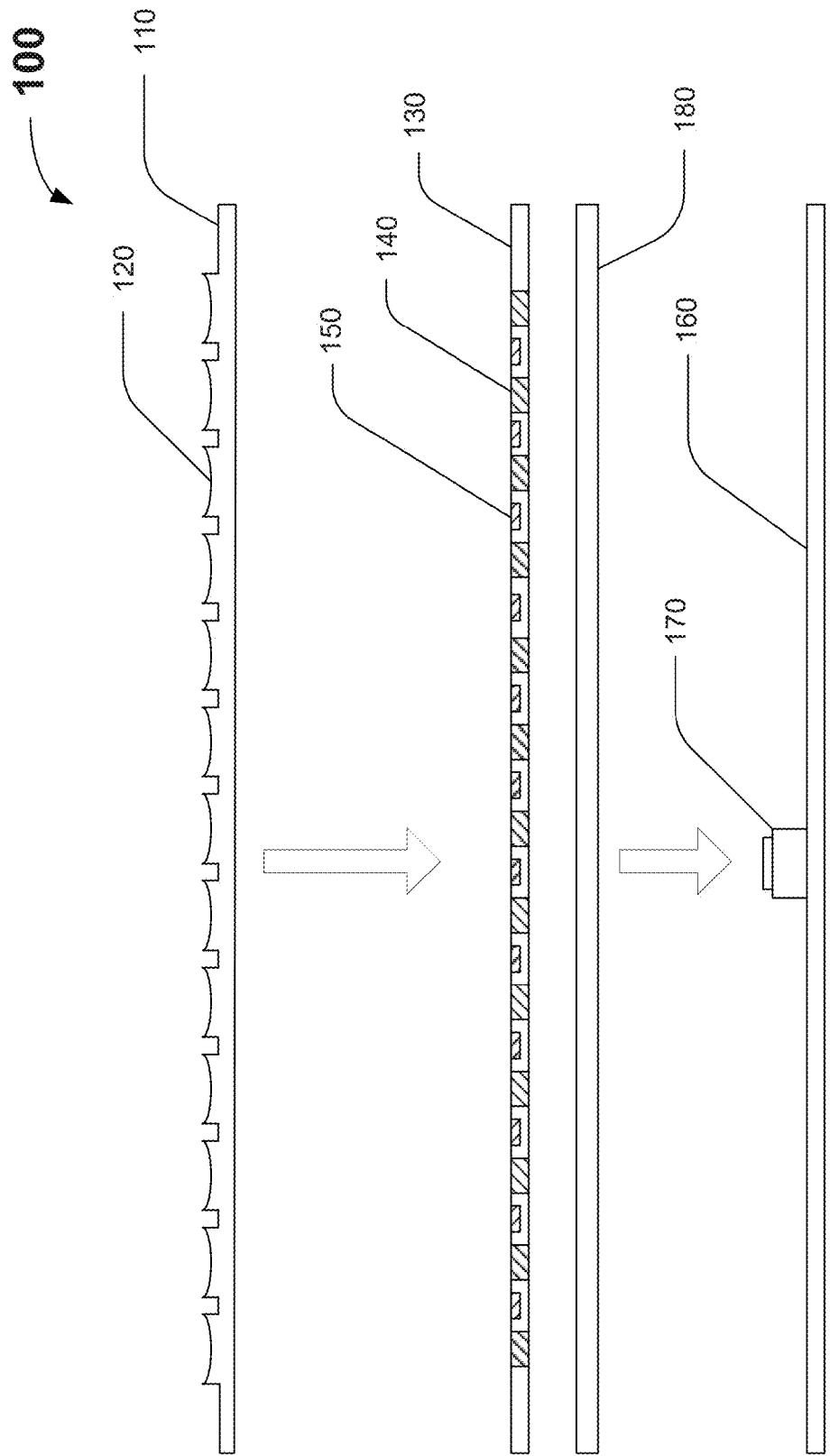
FIG. 1 is a partial exploded elevation view depicting an illustrative keyboard apparatus, according to one or more embodiments described herein.

Keyboards enjoy frequent use as input devices for electronic devices. Given ever increasing public demand, manufacturers have consistently reduced the size and improved the performance of electronic devices ranging from laptop computers to cellular devices. While such reduction in size is often welcomed by consumers, manufacturers are left trying to provide input devices that fulfill consumer's expectation of performance, portability and ease of use, while meeting the manufacturer's requirements of low cost, reliability, and ease of manufacture.

The commonplace nature of keyboards belies their relatively complex nature—within a keyboard one can find a plethora of mechanical switches, processors and communications interfaces. The sheer number and size of these devices often impose practical limits on the keyboard size and performance achievable by a manufacturer. Reducing the size and complexity of a keyboard can therefore provide keyboards better aligned with the needs and expectations of both manufacturers and users.

A keyboard apparatus is provided. The apparatus can include a rigid member comprising a plurality of keycaps and a proximity sensing member comprising a plurality of proximity sensors and a plurality of illuminators disposed proximate the rigid keycap member. The apparatus can also include a backing member comprising a switch disposed proximate the proximity sensing member. A displacement of the rigid member and the proximity sensing member can activate the switch.

A keyboard method is provided. The method can include displacing a rigid member comprising a plurality of keycaps and a proximity sensing member comprising a plurality of proximity sensors and a plurality of illuminators. The method can also include sensing the location of the displacement force using at least a portion of the plurality of proximity sensors; and activating a switch disposed on a backing member in response to the displacement force.

A keyboard system is also provided. The system can include a housing a rigid member comprising a light guide, a plurality of keycaps and at least one character disposed on at least a portion of the plurality of keycaps disposed at least partially within the housing. The system can further include a proximity sensing member comprising a plurality of proximity sensors and a plurality of illuminators disposed at least partially within the housing. The proximity sensing member can be disposed proximate the rigid keycap member. At least a portion of the light provided by the plurality of illuminators can be transmitted through the at least one character disposed on at least a portion of the plurality of keycaps. The system can also include a backing member comprising a switch disposed at least partially within the housing. The switch can be disposed proximate the proximity sensing member and a displacement of the rigid member and the proximity sensing member can activate the switch. The system can also include a processor to generate an output signal wherein the signal content is determined at least in part based upon the location of a displacement force applied to the rigid member and the activation of the switch.

FIG. 1 is a partial exploded elevation view depicting an illustrative keyboard apparatus 100, according to one or more embodiments. The apparatus 100 can include a rigid member 110 having a plurality of keycaps 120 disposed thereupon. The rigid member 110 can be disposed proximate a proximity sensing member 130 having a plurality of proximity sensors 140 and a plurality of illuminators 150 disposed therein. The rigid member 110 and the proximity sensing member 130 can be disposed proximate a backing member 160 having a switch 170 disposed thereupon. In some embodiments, a stiffening member 180 can be disposed between the proximity sensing member 130 and the backing member 160 to reduce deflection of the rigid member 110.

The rigid member 110, proximity sensing member 130 and the backing member 160 can be disposed adjacent to each other, with the proximity sensing member 130 disposed between the rigid member 110 on top and the backing member 160 on bottom. In such a configuration, the proximity sensing member 130 can detect the presence of one or more objects proximate the top of the rigid member 110, for example the presence of a user's finger above a specific keycap 120 on the rigid member 110. If the user presses the keycap in a downward direction, the rigid member 110 and the proximity sensing member 130 can be displaced, compressing or otherwise actuating the switch 170 disposed on the top surface of the backing member 160. The two data points, the location of the one or more objects on the rigid member 110 and the displacement of the switch 170 can provide one or more data inputs to the apparatus 100.

The terms "top," "bottom," "above," "below," "upper," "lower," and other like terms used herein refer to relative positions to another and are not intended, nor should be interpreted, to denote a particular absolute direction or spatial orientation. For example, a feature described as being on the "bottom" surface of a device could be on the "top" surface or a "side" surface of the device if the device is rotated or inverted; such rotation or inversion is envisioned to be within the scope of one or more claimed embodiments described herein.

The rigid member 110 can include any number of systems, devices, or combination of systems and devices suitable for providing a rigid member having a plurality of keycaps 120. The rigid member 110 can be a single member or multiple connected members, for example a plurality of members connected by a hinge. In some embodiments, the rigid member 110 can be a transparent or translucent material, such materials can permit the transmission of a sidelight or backlight through all or a portion of the rigid member 110. For example, rigid member 110 can be a coated translucent material with a portion of the coating removed from each keycap 120 to form a character thereupon.

Where the keycap 120 characters are exposed translucent material, one or more illuminators 150 disposed on the proximity sensing member 130 can backlight the keycap 120, enabling a user to more easily detect the character. In some embodiments, all or a portion of the rigid member 110 can be a light guide member, i.e., a member adapted to transmit incident light from a first point to a second point elsewhere on the member.

The plurality of keycaps 120 can include any number of keycaps or similar structures. While raised keycaps 120 are depicted in FIG. 1, any form or structure, such as planar or even recessed keycaps, could be employed with equal efficacy. The plurality of keycaps 120 can include keycaps having the same or differing shapes or geometries. For example, a first portion of the plurality of keycaps 120 can include caps having a smaller, first size (e.g., "character" or "letter" keycaps); a second portion of the plurality of keycaps 120 can include caps having a middle, second, size (e.g., "shift," "control," and "alt" keycaps); and the remaining portion of the plurality of keycaps 120 can include caps having a large, third, size (e.g. "space bar" keycaps).

In some embodiments, all or a portion of each of the plurality of keycaps 120 can include an exposed translucent material, for example around the base of the plurality of keycaps 120. For example, in some embodiments, at least a portion of the plurality of keycaps 120 can include a planar keycap flush with the surface of the rigid member 110 bordered by a translucent perimeter defining the extent of the keycap 120.

The proximity sensing member 130 can include any number of systems, devices, or any combination of systems and devices adapted to detect the presence of an object above the rigid member 110. A plurality of proximity sensors 140 can be disposed in, on, or about the proximity sensing member 130. In some embodiments, a plurality of illuminators 150 can be disposed in, on, or about the proximity sensing member 130. In at least some embodiments, the proximity sensing member 130 can be, in whole or in part, a light guide member, i.e., a member capable of transmitting all or a portion of the incident light along at least a portion of the member. The proximity sensing member 130 can be of a shape or physical configuration complimentary to the rigid member 110, for example, the proximity sensing member 130 can fit, in whole or in part, into a recess disposed on the lower surface of the rigid member 110.

Each of the plurality of proximity sensors 140 can include any number of systems, devices, or any combination of systems and devices suitable for detecting the presence of a nearby object, for example a finger disposed above the rigid member 110. Each of the plurality of proximity sensors 140 can use any detection technology known in the art, including inductive, capacitive, magnetic, optical, reflected wave (e.g., RADAR or SONAR), or the like. The plurality of proximity sensors 140 can use identical detection technology or different detection technologies, for example a mix of inductive and capacitive sensors could be used to provide the plurality of proximity sensors 140. In some embodiments, the plurality of proximity sensors 140 can be provided using a membrane matrix pad.

In at least some embodiments, each of the plurality of proximity sensors 140 can have differing sizes corresponding to differing keycap sizes, for example a portion of the proximity sensors 140 can include sensors having a smaller, first size (e.g., sensors corresponding to "character" or "letter" keycaps); a portion can include sensors having a middle, second, size (e.g., sensors corresponding to "shift," "control," and "alt" keycaps); and a portion can include sensors having a large, third, size (e.g., sensors corresponding to "space bar" keycaps).

In at least some embodiments, the plurality of illuminators 150 can be disposed in, on, or about the proximity sensing member 130. At least a portion of the light provided by the plurality of illuminators 150 can be transmitted or otherwise conveyed through the proximity sensing member 130. At least a portion of the light provided by the plurality of illuminators 150 can be transmitted or otherwise conveyed through the rigid member 110. At least a portion of the light provided by the plurality of illuminators 150 can be transmitted through one or more translucent areas disposed on the rigid member 110, for example through translucent characters disposed on the plurality of keycaps 120.

Each of the plurality of illuminators 150 can include any number of systems, devices, or any combination of systems and devices suitable for providing light within the visible spectrum. Each of the plurality of illuminators 150 can use any illumination technology known in the art, including light emitting diodes ("LEDs"), organic LEDs ("OLEDs"), active matrix OLEDs ("AMOLEDs"), incandescent, fluorescent, and the like. The plurality of illuminators 150 can use identical illumination technology or different illumination technology, for example fluorescent and LED illuminators can provide the plurality of illuminators 150.

The plurality of proximity sensors 140 and the plurality of illuminators 150 can be battery or line powered. The energy required to power the plurality of proximity sensors 140 and the plurality of illuminators 150 can be supplied using either a external or an on-board energy source. In some embodiments, all or a portion of the energy can be supplied via one or more onboard power cells, batteries, solar cells, or the like. In some embodiments, all or a portion of the energy can be supplied via a wired connection to another device, for example a Universal Serial Bus ("USB") connection.

The backing member 160 can include any systems, devices, or any combination of systems and devices suitable for providing a rigid or semi-rigid platform or foundation for the proximity sensing member 130 and the rigid member 110. The backing member 160 can be a single member, or a plurality of attached members, for example two members attached using one or more hinges. One or more electronic devices can be disposed in, on, or about the backing member 160. For example one or more switches, processors, transmitters, power supplies, or the like can be disposed in, on, or about the backing member 160. The backing member 160 can be any material, including metallic, for example an aluminum member; non-metallic, for example a carbon fiber member; or composite (i.e., materials containing both metallic and non-metallic components), for example a metallic core encapsulated with a polymeric compound.

The switch 170 can include any number of systems, devices, or any combination of systems and devices suitable for providing an electrical input to a processor. The electrical input can be in whole or in part in response to a user provided force on a keycap 120 disposed on the rigid member 110. The switch 170 can be an electrical or electro-mechanical device. The switch 170 can be a mechanical device, for example a scissors type switch found in some keyboards. Since keyboards having in excess of 100 keycaps enjoy widespread use, the reduction from in excess of 100 switches to a single switch can, in some embodiments, provide reduced manufacturing costs, improved reliability, and compact packaging of the keyboard to meet consumer demand.

The switch 170 can be mounted at any point on the backing member where a force applied to a keycap 120 on the rigid member 110 can be transmitted in whole or in part to the switch 170. While a central mounting of the switch 170, as depicted in FIG. 1, is one option, other mountings such as offset to one side of the backing member 160 provide additional options. In some embodiments, one or more stays or guides can be provided to permit an equal distribution of force across the rigid member 110 regardless of the position of the keycap 120 pressed by the user, such an installation would permit disposal of the switch 170 at any point on the backing member 160. In some embodiments, one or more stays or guides can be provided to minimize the likelihood, or prevent, skewing of the keyboard when a keycap is depressed by a user.

In some embodiments, a stiffening member 180 can be disposed between the proximity sensing layer 160 and the switch 170. A stiffening member 180 can add structural strength and improve the reliability of the keyboard system 100, for example when the proximity sensing layer 160 comprises a flexible membrane sensor having minimal inherent structural strength. The stiffening member 180 can be any material, including metallic, for example an aluminum member; non-metallic, for example a carbon fiber member; or composite (i.e., materials containing both metallic and non-metallic components), for example a metallic core encapsulated with a polymeric compound.

Figure 2:
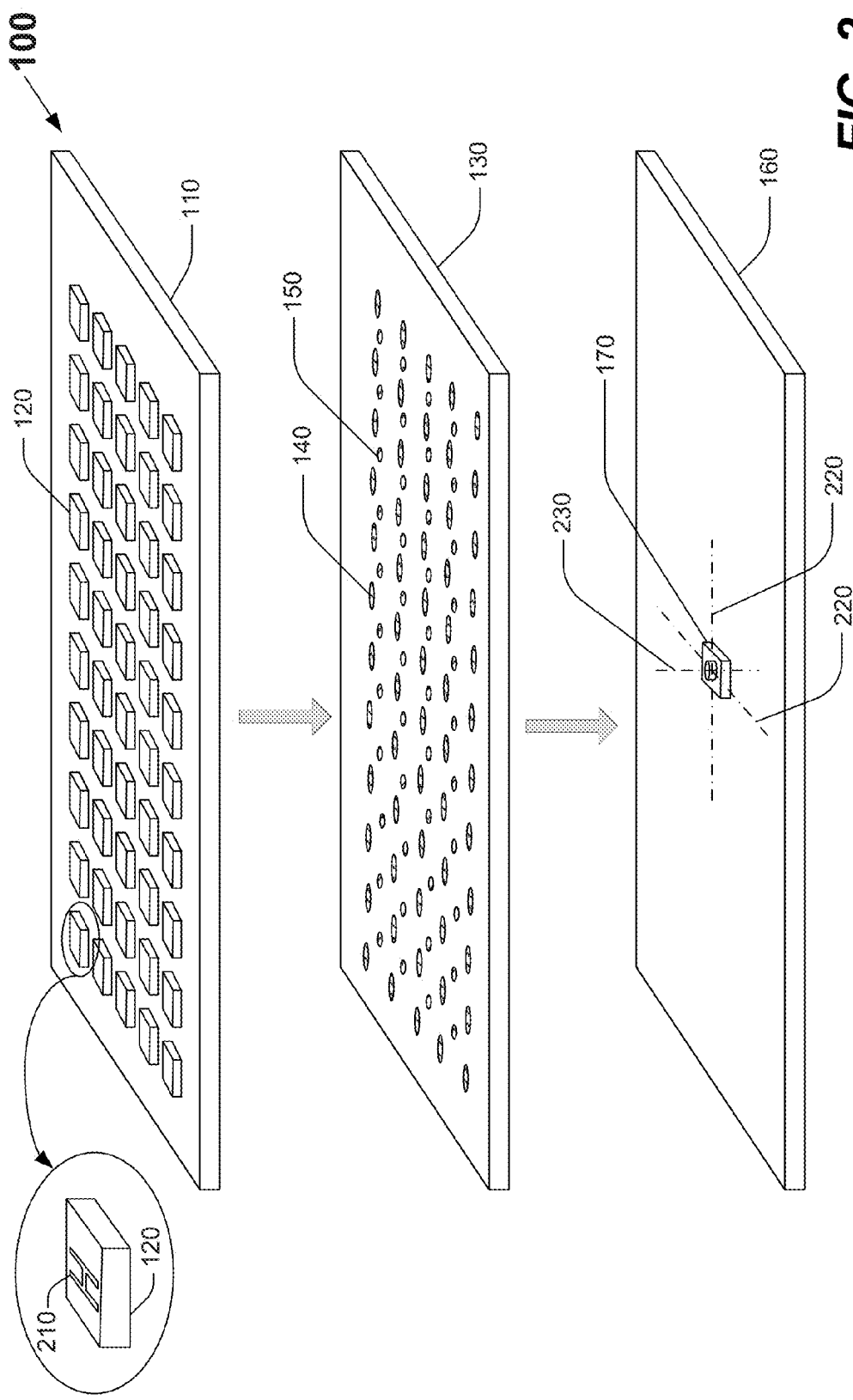
FIG. 2 is an upper perspective view depicting the illustrative keyboard apparatus depicted in FIG. 1, according to one or more embodiments described herein.

FIG. 2 is an upper perspective view depicting the illustrative keyboard apparatus 100 depicted in FIG. 1, according to one or more embodiments. The system can include a plurality of keycaps 120, each having at least one character 210 disposed thereupon. In some embodiments, all or a portion of the keycap 120 or the rigid member 110 upon which the keycap is disposed can be formed from a material suitable for the transmission of at least a portion of light incident thereupon.

The system 100 can include a switch 170 disposed on the backing member 160. In some embodiments, three orthogonal axes can be defined through the switch 170. In some embodiments, a first and second axis 220 can define a plane formed by the backing member 160 and a third axis 230 can define a normal to the plane. In some embodiments, one or more limits or stays can be used to limit or prevent the motion, movement, or displacement of the rigid member 110, the proximity sensing member 130, or both the rigid member 110 and the proximity sensing member 130 along the first and second axes 220.

A displacement of the rigid member 110, for example a displacement by a user pressing one or more of the keycaps 120, can result in the application of a force along the third axis 230 to the switch 170. Application of sufficient force to the rigid member 110 by the user can activate the switch 170. In some embodiments, upon activation of the switch 170, the position of the user's hands on the keycaps 120 can be collected by the one or more proximity sensors 140. In at least some embodiments, the proximity sensing member 130 can filter or otherwise distinguish which of the keycaps 120 received the greatest displacement force, for example to distinguish the keycap pressed by a "touch-typist" user having their hands resting on the "home" keys when a keycap 120 is depressed.

FIGS. 3A and 3B will be discussed in detail together as an aid to clarity and readability. FIG. 3A is a partial sectional view depicting the illustrative keyboard apparatus 100 depicted in FIG. 1 disposed in a first position, according to one or more embodiments. FIG. 3B is a partial sectional view depicting the illustrative keyboard apparatus 100 depicted in FIG. 1 disposed in a second position, according to one or more embodiments. The system 300 can include a housing 310 partially or completely disposed about the system 100. A processor 320 can be coupled to the system 100, for example a processor 320 can be coupled to the proximity sensors 150 and the switch 170.

Referring to FIG. 3A, with no displacement force applied to the system, the rigid member 110 and the proximity sensing member 130 can be in a first position, allowing the switch 170 to remain in a first, default, position, such as a non-activated or open position. Referring to FIG. 3B, when a displacement force 330 is applied to the rigid member 110, for example when a user presses a keycap 120, the rigid member 110 and the proximity sensing member 130 can be can be displaced to a second position, where the switch 170 is in a second position, such as an activated or closed position.

In some embodiments, when a displacement force 330 is applied to one or more keycaps 120, at least one proximity sensor 140 can determine the location of the displacement force 330. The location of the displacement force 330 can be transmitted to a processor 320 coupled to the proximity sensing member 130. Within the processor 320, the location of the displacement force 330 can be translated into a code corresponding to the character on the keycap 120 location. When sufficient displacement force 330 has been applied, the switch 170 can be activated, the activation of the switch 170 can also be transmitted or otherwise communicated to the processor 320. Within the processor 320, the simultaneous receipt of displacement force 330 location and switch 170 activation can cause the processor to transmit at least one signal 340 to an external device. For example, the simultaneous receipt of displacement force 330 location and switch 170 activation can cause the processor to transmit a Bluetooth® wireless signal 340 to an electronic device coupled to the system 300.

Figure 4:
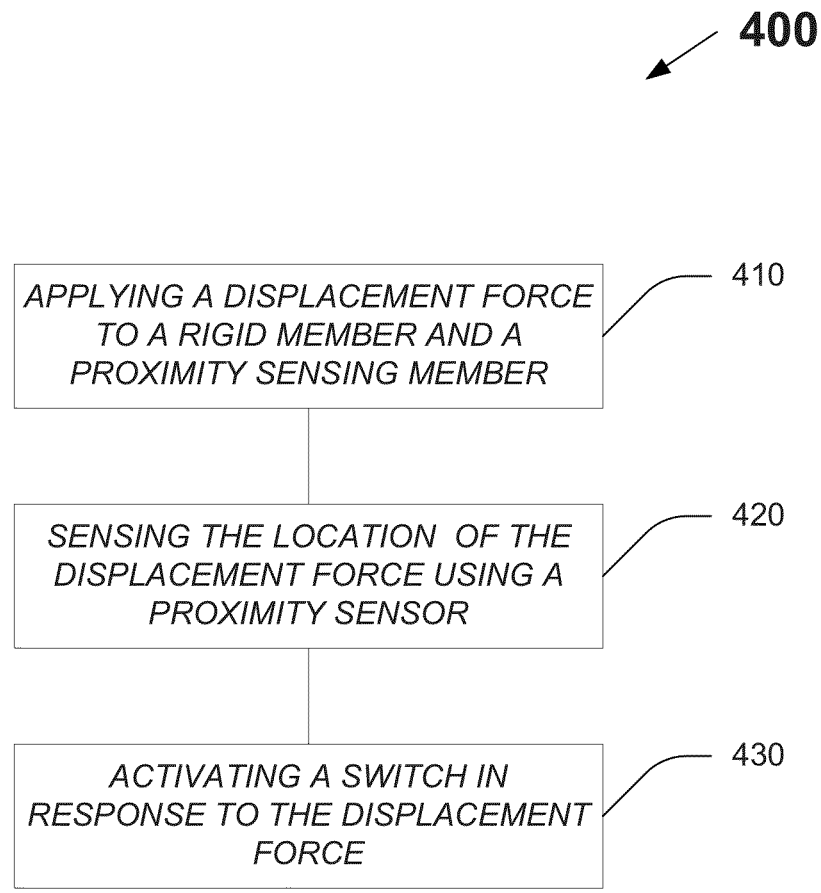
FIG. 4 is a flow diagram depicting an illustrative keyboard method, according to one or more embodiments described herein.

FIG. 4 is a flow diagram depicting an illustrative keyboard method 400, according to one or more embodiments. The method can include applying a displacement force 330 to a rigid member 110 and a proximity sensing member 130 at 410. The displacement force 330 can include, among others, a simple finger stroke applied to a keycap 120 disposed on the rigid member 110.

The method can also include sensing the location of the displacement force 330 using a proximity sensor 140 at 420. The proximity sensor can be disposed in on or about the proximity sensing member 130 and can include one or more types of proximity sensors 140, including, but not limited to a membrane matrix pad; an inductive proximity sensor; a capacitive proximity sensor; an optical proximity sensor; an ultrasonic proximity sensor; and an infra-red proximity sensor.

Once sufficient displacement force 330 is applied to by the user, the method can include activating a switch 170 in response to the displacement force 330 at 430. In some embodiments, the switch 170 can include a normally open mechanical switch that is closed by the application of the displacement force 330 to the rigid member 110.

Figure 5:
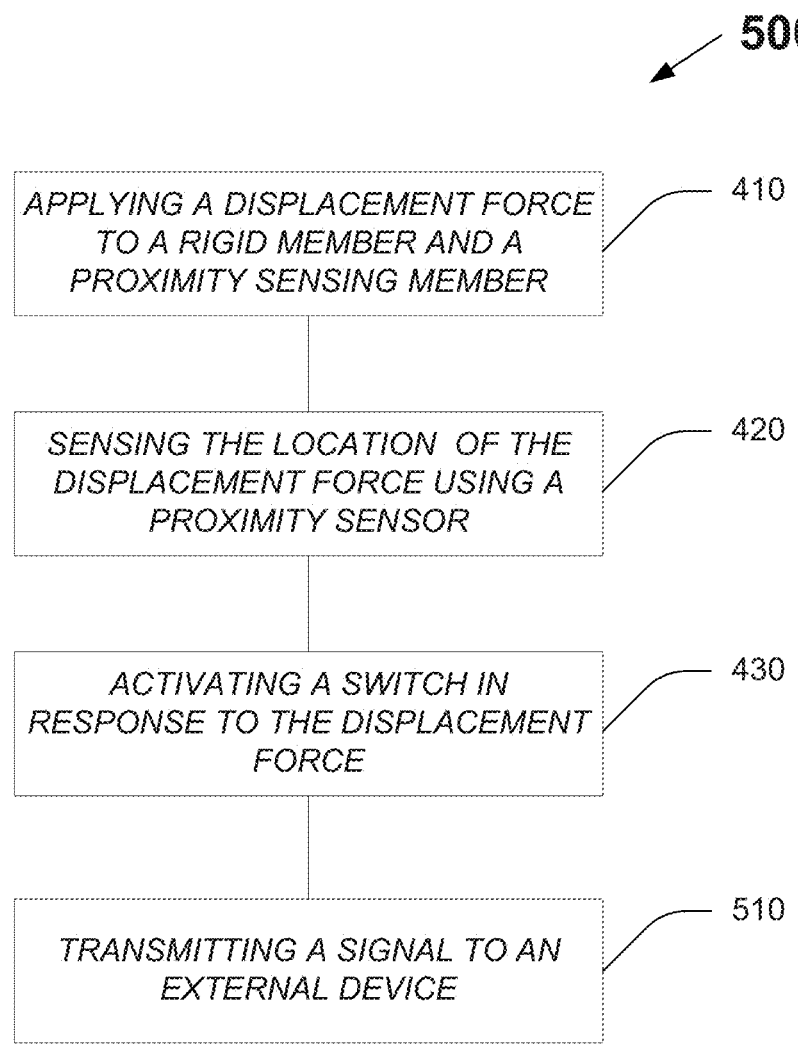
FIG. 5 is a flow diagram depicting another illustrative keyboard method, according to one or more embodiments described herein.

FIG. 5 is a flow diagram depicting another illustrative keyboard method 500, according to one or more embodiments. The method 500 can include the method 400 described in detail above with respect to FIG. 4, and can also include transmitting a signal 340 to an external device at 510. In some embodiments, the proximity sensor can detect the location of the displacement force 330 on the rigid member 110, and transmit the location information to the processor 320. Upon application of sufficient force 330, the switch 170 can activate, transmitting one or more signals to the processor 320.

The receipt of the switch 170 activation signal can, in some embodiments, cause the processor 320 to transmit a signal 340 containing, in whole or in part, information on the location of the displacement force, for example a signal containing information on a specific keycap 120 at the location of the applied displacement force. The signal 340 can be transmitted over a wired connection (e.g., Universal Serial Bus, "USB"); or a wireless connection (e.g., Bluetooth®) to an external device, for example an input/output "I/O" port coupled to an electronic device.

While the foregoing is directed to embodiments of the present invention, other and further embodiments of the invention may be devised without departing from the basic scope thereof, and the scope thereof is determined by the claims that follow.

I claim:

1. A keyboard apparatus, comprising:
a rigid member comprising a plurality of keycaps;
a proximity sensing member comprising a plurality of proximity sensors and a plurality of illuminators;
  wherein the proximity sensing member is disposed proximate the rigid member; and
a backing member comprising a switch;
  wherein the switch is disposed proximate the proximity sensing member; and
  wherein each keycap causes a displacement of the rigid member and the proximity sensing member which activates the switch.

2. The apparatus of claim 1, further comprising:
a stiffening member disposed between the proximity sensing member and the backing member.

3. The keyboard apparatus of claim 1, wherein the plurality of illuminators are selected from the group of illuminators consisting of: a light emitting diode ("LED"); an organic light emitting diode ("OLED"); an incandescent source; and a fluorescent source.

4. The keyboard apparatus of claim 1,
wherein the rigid member comprises a light guide material;
wherein at least one character is etched into at least a portion of the plurality of keycaps; and
wherein at least a portion of the at least one character is illuminated using at least a portion of the illuminators.

5. The keyboard apparatus of claim 1, wherein the proximity sensor is selected from the group of proximity sensors consisting of: a membrane matrix pad; an inductive proximity sensor; a capacitive proximity sensor; an optical proximity sensor; an ultrasonic proximity sensor; and an infra-red proximity sensor.

6. The apparatus of claim 1, further comprising:
a housing disposed about at least a portion of the rigid member and the proximity sensing member.

7. The apparatus of claim 6, wherein the housing limits the displacement of the rigid member and the proximity sensing member along a plurality of orthogonal axes parallel to the plane defined by the backing member.

8. The apparatus of claim 6, wherein the housing limits the displacement of the rigid member and the proximity sensing member along an axis perpendicular to a plane defined by the backing member.

9. A keyboard method, comprising:
displacing a rigid member comprising a plurality of keycaps and a proximity sensing member comprising a plurality of proximity sensors and a plurality of illuminators;
sensing the location of the displacement force using at least a portion of the plurality of proximity sensors; and
activating a switch disposed on a backing member, wherein each of the plurality of keycaps activates the switch in response to the displacement force.

10. The method of claim 9, further comprising:
transmitting a signal to at least one external device, wherein at least a portion of the signal content is determined by the sensed location of the displacement force on the rigid member at the time the switch is activated.

11. The method of claim 9, wherein the sensing the location of the displacement force comprises:
determining the presence of the object providing the displacement force using a proximity sensor selected from the group of proximity sensors consisting of: a membrane matrix pad; an inductive proximity sensor; a capacitive proximity sensor; an optical proximity sensor; an ultrasonic proximity sensor; and an infra-red proximity sensor.

12. A keyboard system, comprising:
a housing;
a rigid member comprising a light guide, a plurality of keycaps, and at least one character disposed on at least a portion of the plurality of keycaps disposed at least partially within the housing;
a proximity sensing member comprising a plurality of proximity sensors and a plurality of illuminators disposed at least partially within the housing;
  wherein the proximity sensing member is disposed proximate the rigid keycap member; and
  wherein at least a portion of the light provided by the plurality of illuminators is transmissible through the at least one character disposed on at least a portion of the plurality of keycaps;
a backing member comprising a single switch disposed at least partially within the housing;
  wherein the switch is activated by each of the plurality of keycaps and is disposed proximate the proximity sensing member; and
  wherein a displacement of the rigid member and the proximity sensing member activates the switch; and
a processor to generate a signal wherein the signal content is determined at least in part based upon the location of a displacement force applied to the rigid member and the activation of the switch.

13. The system of claim 12, wherein the housing permits the displacement of the rigid member and the proximity sensing member along an axis perpendicular to the plane defined by the backing member.

14. The system of claim 12, wherein the housing limits the displacement of the rigid member and the proximity sensing member along a plurality of orthogonal axes parallel to the plane defined by the backing member.

15. The system of claim 12, wherein the proximity sensor is selected from the group of proximity sensors consisting of: a membrane matrix pad; an inductive proximity sensor; a capacitive proximity sensor; an optical proximity sensor; an ultrasonic proximity sensor; and an infra-red proximity sensor.

* * * * *